United States Patent
Claussen et al.

(10) Patent No.: US 6,245,640 B1
(45) Date of Patent: Jun. 12, 2001

(54) METHOD FOR FABRICATING A SEMICONDUCTOR STRUCTURE

(75) Inventors: Wilhelm Claussen; Barbara Lorenz, both of Dresden; Klaus Penner, Ottendorf-Okrilla; Mirko Vogt; Hans-Peter Sperlich, both of Dresden, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/407,263

(22) Filed: Sep. 27, 1999

(30) Foreign Application Priority Data

Sep. 27, 1999 (DE) .............................................. 198 44 102

(51) Int. Cl.$^7$ ................................................. H01L 21/76
(52) U.S. Cl. .......................... 438/424; 438/430; 438/275; 438/700
(58) Field of Search ................................. 438/424, 430, 438/275, 700

(56) References Cited

U.S. PATENT DOCUMENTS

| | | |
|---|---|---|
| 5,112,762 | 5/1992 | Anderson et al. . |
| 5,506,178 * | 4/1996 | Suzuki et al. . |
| 5,776,808 | 7/1998 | Muller et al. . |
| 6,035,803 * | 3/2000 | Robles et al. ................. 118/723 |

FOREIGN PATENT DOCUMENTS

| | | |
|---|---|---|
| 0819786A2 | 1/1998 | (EP) . |
| 0908937A2 | 4/1999 | (EP) . |

OTHER PUBLICATIONS

"Physical and optical properties of an antireflective layer based on SiOxNy", F. Gaillard et al., J. Vac. Sci. Technol., vol. 15, No. 5, Sept./Oct. 1997, pp. 2777–2780.

* cited by examiner

*Primary Examiner*—Long Pham
(74) *Attorney, Agent, or Firm*—Herbert L. Lerner; Laurence A. Greenberg; Werner H. Stemer

(57) ABSTRACT

An antireflection layer, preferably a dielectric antireflection layer, is applied by PECVD to a hard mask layer which is composed of doped silicon oxide, with no interruption of the vacuum. The silicon oxide layer is then patterned to form a hard mask and, by way of example, a deep trench etching is performed. The hard mask is removed using an $HF/H_2SO_4$ mixture or using an HF/ethylene glycol (EG) mixture at a high etching rate. If the HF/EG mixture is used, an intermediate layer that may be disposed underneath can simultaneously be etched back by a predetermined amount. The integration of two wet etching steps constitutes a major simplification compared with the previous wet etching methods in two different installations.

8 Claims, 1 Drawing Sheet

METHOD FOR FABRICATING A SEMICONDUCTOR STRUCTURE

BACKGROUND OF THE INVENTION

FIELD OF THE INVENTION

The invention relates to a method for fabricating a semiconductor structure in an integrated circuit, in particular a method for fabricating a hard mask and a method for removing the hard mask.

Silicon oxides are among the most frequently used materials in semiconductor technology. Various types of silicon oxides (glasses) are known which differ in terms of their composition, their properties and their fabrication, for example thermal and deposited oxides, TEOS, and doped oxides. They are used as insulation materials in many cases. A further important application is their use as a hard mask during the etching of layers lying at a deeper level. A hard mask of this type is removed again after the etching process.

A photolithographic process is required to produce the hard mask. In order to reduce pattern transfer errors in the course of this, it is possible to apply an antireflection layer (ARC) to the hard mask layer, for which purpose a plasma-enhanced deposition process is usually used. Customary methods provide for the hard mask layer composed of a silicon oxide to be applied in the vacuum chamber of a first installation and for the antireflection layer then to be applied in a second installation.

After the patterning process, the hard mask composed of silicon oxide should be removed wet-chemically as quickly as possible and usually selectively with respect to other layers that are present (for example thermal silicon oxide layers and silicon nitride layers). This requires a high, numerically accurately known etching rate for the hard mask. As a result of the effect of the plasma-enhanced deposition process for the antireflection layer on the exposed silicon oxide layer, however, the etching rate of the latter is reduced in an uncontrolled manner. The change in the etching rate can be attributed to chemical and physical layer modifications due to the subsequent plasma deposition. Since the etching rate of the hard mask layer cannot adequately be controlled, under manufacturing conditions the hard mask is not removed with a fixed process time, rather the process time is determined in a separate precursor test for a certain number of wafers (that is to say a batch). An individual etching time is established in this way for each batch. It is only by this time-consuming and cost-intensive procedure that an excessively high erosion of other layers present on the wafer can be avoided.

One example of the use of a hard mask made of doped silicon oxide with a superior antireflection layer is the etching of capacitor trenches in a silicon substrate, in particular for one-transistor memory cells. In the case of the etching process, an intermediate layer composed of thermal silicon oxide and/or silicon nitride is generally disposed directly on the substrate surface and must not be attacked, or may be attacked only slightly, during the removal of the hard mask after the trench etching. It may be expedient to etch the intermediate layer back horizontally by a defined amount (so-called pull back), for example in order to enable the trench to be better able to be filled. According to a known method, in order to remove the silicon oxide-based hard mask layers, mixtures containing $H_2SO_4$/HF are used here at approximately 60° C on a spin etcher. The selectivity of the erosion of a doped glass layer with 4% by weight of boron with respect to the erosion of a thermal silicon oxide layer that is likewise situated on the wafer is approximately 35:1 in this case. In order to prevent an impermissibly high erosion of the thermal oxide, from each batch one wafer is subjected separately to a preliminary process step for determining the etching rate. The entire batch is subsequently processed with the etching time resulting from the etching rate that has been determined in this way. This step preceding the actual etching process considerably reduces the wafer throughput. After the removal of the hard mask, in a further process step, the edges of the silicon nitride layer situated under the hard mask are etched back by isotropic etching using an HF/ethylene glycol mixture in another etching installation.

It is known to increase the wet etching rate of doped silicon oxide hard masks by increasing the dopant concentration of the layers. However, this reduces their layer stability in the etching process, that is to say the layers no longer satisfy the requirements Appertaining to their use as a mask.

SUMMARY OF THE INVENTION

It is accordingly an object of the invention to provide a method for fabricating a semiconductor structure, which overcomes the above-mentioned disadvantages of the prior art methods of this general type.

With the foregoing and other objects in view there is provided, in accordance w-th the invention, a method for fabricating a semiconductor structure, which includes depositing a doped silicon oxide layer on a support in a first CVD step; depositing an antireflection layer on the doped silicon oxide layer in a plasma-assisted second CVD step with no interruption of vacuum conditions for the support between the first CVD step and the plasma-assisted second CVD step; patterning of the doped silicon oxide layer and of the antireflection layer for forming a mask; etching the support using the mask; removing the antireflection layer; and removing the doped silicon oxide layer using an etching solution containing at least one of HF and ethylene glycol and sulfuric acid.

The invention is based on the problem of specifying a method for fabricating the stable hard mask, composed of silicon oxide, and the antireflection layer lying above it, and also of specifying an etching method which enables the silicon oxide hard mask to be removed at a high etching rate. The etching method is intended to have a high selectivity, and if appropriate a selectivity that is adjustable in a defined manner, with respect to other layers, in particular with respect to an intermediate layer made of thermal silicon oxide and/or silicon nitride.

The method according to the invention is based on applying a hard mask layer composed of a doped silicon oxide and an antireflection layer successively with no interruption of the vacuum conditions for the wafer by plasma-enhanced deposition processes. The invention is also based on using a mixture of HF and ethylene glycol (EG) and/or sulfuric acid for the removal of the hard mask, which mixture, for the hard mask thus fabricated, has both a high etching rate and a high and defined selectivity with respect to further layers possibly present on the substrate.

As a result of the "in situ" application of the antireflection layer to the silicon oxide layer, the direct effect of the surrounding atmosphere on the silicon oxide layer is reduced and the absorption of moisture is distinctly reduced. This results in a higher etching rate for the silicon oxide layer.

At the same time, a higher deposition rate is obtained during the fabrication of the antireflection layer, with the result that the deposition can be effected in a shorter time and the exposure of the hard mask layer to plasma is reduced. This results in less modification of the layer properties and a higher etching rate for the hard mask.

A doped glass containing from 2 to 9% by weight of B and/or 2 to 9% by weight of P is preferably used as the hard mask layer. In this case, a boron concentration of from 3.5 to 4% without the addition of phosphorus is particularly referred, since such a doped glass layer (BSG) has particularly good hard mask properties. A customary ozone-assisted SA (sub-atmosphere) CVD process can be used for fabricating the layer. In particular if a heavily doped layer ($\geq 4\%$ by weight of B) is used, an inert plasma step can be carried out before the deposition of the antireflection layer, the step serving for strengthening the BSG layer and no layer deposition being effected in the step. The inert plasma step can be adapted to the specific requirements, by altering the plasma power and the process time, to the effect that it is possible to fulfill the demands both for sufficient hard mask stability and for a high BSG wet etching rate. In this case, an inert gas, for example argon, helium or nitrogen, is appropriate also $N_2O$, are fed in as process gasses. A dielectric, for example an oxynitride (SiOxNy), is preferably used as the antireflection layer.

Wet etching using an HF—$H_2SO_4$ mixture may be employed for etching the glass layer fabricated in this way. With the novel deposition process, an etching rate of approximately 2000–3000 nm/min is achieved in this case (compared with approximately 600 nm/min in the case of the previous method) and the selectivity with respect to thermal oxide or nitride is correspondingly increased. By virtue of the novel integrated method of depositing the hard mask and the antireflection layer, therefore, a greatly increased etching rate and selectivity are obtained with the previous wet etching process. By way of example, it is possible to use an HF/$H_2SO_4$ mixture in a mixing ratio of 1/7 at a process temperature of approximately 60° C.

Furthermore, it is possible to employ wet etching using an HFEG mixture having preferably from 2 to 10% by volume of HF and from 90 to 98% by volume of EG. A wet etching rate for doped oxides are from 200 to 1000 nm/min is obtained. The selectivity with respect to thermal silicon oxide or silicon nitride lies in the range from 70 to 550:1.

As a result of the high selectivity, it is possible to remove the hard mask with a fixed process time (without a precursor test) with both etching processes in the exemplary embodiment explained above. The processing time is significantly reduced by the omission of the complex determination of the etching time for each batch. Furthermore a shorter etching time is required. Overall, the processing time is reduced to approximately 40–50% compared with the conventional method.

The method can be applied in a particularly advantageous manner, using an HF-EG etching solution, in the case of the example specified above in which the hard mask is applied on an intermediate layer made of thermal oxide and nitride and a pull-back of the intermediate layer is intended to be carried out after the removal of the hard mask. Two different etching methods are necessary for this purpose in the case of the known method. The method according to the invention affords the advantage that both etching steps can be integrated into one etching step, since there is a sufficiently high and adjustable selectivity between the etching of the hard mask and of the intermediate layer.

If conventional HF—$H_2SO_4$ etching is carried out in the example specified, a considerable amount of time is likewise saved. However, the selectivity with respect to the intermediate layer is so high that the pull-back has to be effected in a separate step using HF-EG.

Other features which are considered as characteristic for the invention are set forth in the appended claims.

Although the invention is illustrated and described herein as embodied in a method for fabricating a semiconductor structure, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
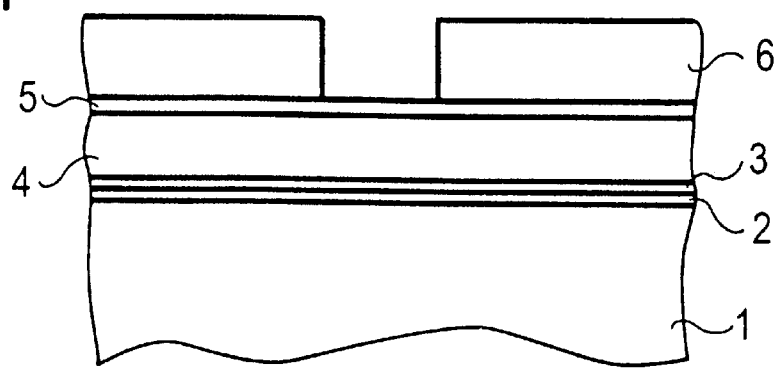
FIGS. 1 to 3 are diagrammatic, sectional views through a semiconductor substrate illustrating method steps of an exemplary embodiment according to the invention.

In all the figures of the drawing, sub-features and integral parts that correspond to one another bear the same reference symbol in each case. Referring now to the figures of the drawing in detail and first, particularly, to FIG. 1 thereof, there is shown a thermal silicon oxide layer 2 having a layer thickness of approximately 8 nm produced on a semiconductor substrate 1 composed of silicon. A silicon nitride layer 3 having a layer thickness of approximately 200 to 250 nm is deposited on top of this. The intermediate layer 2, 3 (in this case a double layer) is required for example as a protective layer in subsequent method steps which are not relevant to the actual etching process. A hard mask layer 4 composed of doped silicon oxide is applied to the nitride layer 3 to a thickness of approximately 700 nm. An SACVD process is started in a vacuum chamber (for example AMAT P5000 installation), the parameters being set in such a way that the glass layer has a doping of from 3.5 to 4.5% by weight of boron. After the deposition process has ended, the vacuum conditions for the wafer are maintained, that is to say the wafer is moved into a second chamber (PECVD chamber) with no interruption of the vacuum conditions. An inert plasma is ignited for the purpose of densifying the glass layer, during which helium and $N_2O$, by way of example, are introduced into the process chamber. For this purpose, it is possible to set an $N_2O$ flow of up to 1000 sccm and a helium flow of up to 8000 sccm, and also a process pressure in the range of 1–10 torr and power in the range of 50–500 watts. The inert plasma step may last for approximately one minute. If the glass layer is doped relatively weakly, it is also possible to dispense with the inert plasma step. A dielectric antireflection layer 5, in particular an oxynitride, is subsequently applied to the doped glass layer 4 by a plasma-enhanced deposition process with no interruption of the vacuum conditions, preferably in the same process chamber. The thickness of the antireflection layer 5 is dependent on the optical properties and preferably lies in the range of 40–200 nm. The following process parameters are preferably set.

Silane flow 40–100 sccm, $N_2O$ flow 90–150 sccm, inert gas flow (He, Ar, $N_2$) 1000–5000 sccm, process pressure 5–7 torr, HF power 70–170 W.

Deposition rates for the dielectric antireflection layer 5 of 200–400 nm/minute can thus be achieved. A resist mask 6, which corresponds to the hard mask 4 to be fabricated, is then applied to the configuration thus far completed.

Figure 2:
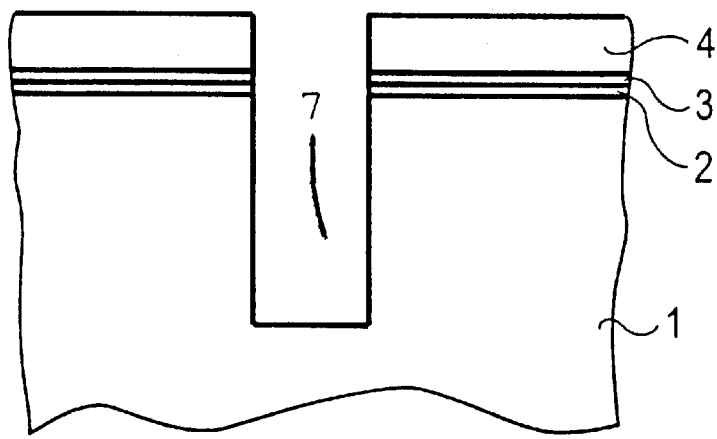

In FIG. 2, the resist mask 6 is used for patterning the antireflection layer 5, the doped glass layer 4 and also the intermediate layer 3, 2. The resist mask 6 is then removed. The doped glass layer 4 with the antireflection layer 5 lying over it then serves as a hard mask for etching the silicon substrate 1. The antireflection layer 5 is completely eroded in the course of the etching of a trench 7 into the substrate 1.

Figure 3:
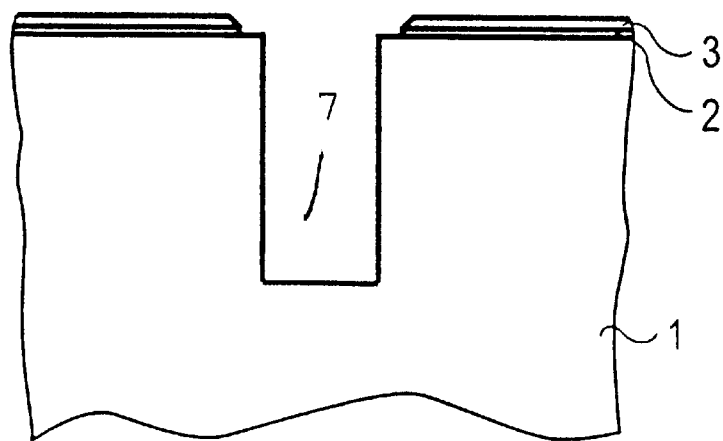

In FIG. 3 residues of the hard mask 4 that have remained should be removed with a wet-chemical process as rapidly as possible and with sufficient selectivity with respect to the intermediate layer 2, 3 after the etching of the trench 7. Furthermore, in an upper region of the trench 7, the nitride layer 3 has to be etched back laterally by approximately 10 to 14 nm. Any oxidic deposits present from the trench etching must likewise be removed. For this purpose, use is made of an HF-EG mixture in a ratio of 4:96, which is heated to approximately 80° C. The etching process can be carried out in a Semitol installation.

In this case, the wafers are placed into a rotatable mount in a batch of from 25 to 50 wafers and conditioned with $N_2$ and glycol. They are subsequently sprayed uniformly with the temperature-regulated etching mixture. Afterwards, the etching mixture is completely removed again in a series of rinsing steps and the wafers are finally dried. In this process, the etching rate of the doped glass is approximately 220 (+/−30) nm/min, the etching rate of the nitride is 4.0 (+/−0.4) and the etching rate of the thermal oxide 3.0 (+/−0.3) nm/minute. Accordingly, the selectivity of the hard mask layer 4 with respect to thermal oxide is approximately 75. Therefore, the etching of the doped glass with respect to thermal oxide and with respect to nitride is highly selective, while the thermal oxide and the nitride are at the same time etched approximately at the same rate. It was ascertained that the selectivity of the wet etching rate is critically influenced through the deposition conditions of the doped glass layer and of the antireflection layer 5. On the other hand, the etching rate ratios of the three layers 2, 3 and 4 involved are influenced only slightly by the process temperature and by the proportion of HF in the etching mixture within the limits specified further above.

At the same time as the etching of the doped glass layer 4 and the removal of the oxidic deposits from the trench etching, the intermediate layer 2, 3 is etched back at the open trench wall, to be precise by an amount of approximately 8 to 15 nm. The etching time is approximately 200 seconds. The hard mask 4 is also completely removed during this time, since, in general, the hard mask layer 4 is already thinned somewhat during the etching of the trench 7.

We claim:

1. A method for fabricating a semiconductor structure, which comprises:
   depositing a doped silicon oxide layer on a support in a first CVD step;
   depositing an antireflection layer on the doped silicon oxide layer in a plasma-assisted second CVD step with no interruption of vacuum conditions for the support between the first CVD step and the plasma-assisted second CVD step;
   patterning of the doped silicon oxide layer and of the antireflection layer for forming a mask;
   etching the support using the mask;
   removing the antireflection layer; and
   removing the doped silicon oxide layer using an etching solution containing at least HF and ethylene glycol.

2. The method according to claim 1, which comprises:
   applying an intermediate layer to the support before performing the depositing of the doped silicon oxide layer step; and
   etching the intermediate layer using the mask and the etching solution containing HF and ethylene glycol at a same time as the doped silicon oxide layer is removed, with a result that an edge of the intermediate layer is set back.

3. The method according to claim 2, which comprises forming the intermediate layer with at least one of a thermal silicon oxide layer and a silicon nitride layer.

4. The method according to claim 1, which comprises depositing a dielectric antireflection layer as the antireflection layer.

5. The method according to claim 1, which comprises depositing a silicon oxynitride layer as the antireflection layer.

6. The method according to claim 2, which comprises using an HF/ethylene glycol mixture containing 2–10% by volume of HF and 90–98% by volume of ethylene glycol as the etching solution.

7. The method according to claim 6, which comprises carrying out the etching step at 70–90° C. using the HF/ethylene glycol mixture.

8. The method according to claim 4, which comprises carrying out an inert plasma step for strengthening the doped silicon oxide layer with no interruption of the vacuum between the deposition of the doped silicon oxide layer and of the dielectric antireflection layer.

* * * * *